US012641855B2

(12) United States Patent
Han et al.

(10) Patent No.: US 12,641,855 B2
(45) Date of Patent: May 26, 2026

(54) REGULATED MOBILE ION SYNAPSES

(71) Applicant: INTERNATIONAL BUSINESS MACHINES CORPORATION, Armonk, NY (US)

(72) Inventors: Jin Ping Han, Yorktown Heights, NY (US); Jianshi Tang, Elmsford, NY (US); Kevin K. Chan, Staten Island, NY (US); Ahmet Serkan Ozcan, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 528 days.

(21) Appl. No.: 18/062,552

(22) Filed: Dec. 6, 2022

(65) Prior Publication Data

US 2024/0186386 A1     Jun. 6, 2024

(51) Int. Cl.
| | |
|---|---|
| *H10D 64/00* | (2025.01) |
| *H10D 30/67* | (2025.01) |
| *H10D 64/01* | (2025.01) |
| *H10D 64/68* | (2025.01) |
| *H10D 99/00* | (2025.01) |
| *H10K 10/46* | (2023.01) |

(52) U.S. Cl.
CPC ....... *H10D 64/118* (2025.01); *H10D 30/6739* (2025.01); *H10D 30/6755* (2025.01); *H10D 64/01* (2025.01); *H10D 64/685* (2025.01); *H10D 64/691* (2025.01); *H10D 99/00* (2025.01); *H10K 10/472* (2023.02); *H10K 10/474* (2023.02)

(58) Field of Classification Search
CPC ............. H10D 64/118; H10D 30/6739; H10D 30/6755; H10D 64/01; H10D 64/685; H10D 64/691; H10D 99/00; H10D 30/697; H10D 48/366; H10D 64/037; H10D 30/0411–0415; H10D 30/69–699; H10D 62/50–57; H10K 10/472; H10K 10/474
See application file for complete search history.

(56) References Cited

U.S. PATENT DOCUMENTS

| | | | |
|---|---|---|---|
| 5,172,204 | A | 12/1992 | Hartstein |
| 6,593,195 | B1 | 7/2003 | Deng |
| 7,277,314 | B2 | 10/2007 | Busta |

(Continued)

FOREIGN PATENT DOCUMENTS

| | | | |
|---|---|---|---|
| CN | 114664940 A | * | 6/2022 |
| CN | 120283455 A | | 7/2025 |

(Continued)

OTHER PUBLICATIONS

Dmitriev, S.G. et al., "Distribution of Mobile Ions in Thin Insulator Films at the Insulator-Semiconductor Interface", Semiconductors (2000), vol. 34:8, pp. 931-936.

(Continued)

*Primary Examiner* — Shahed Ahmed

(74) *Attorney, Agent, or Firm* — Harrity & Harrity, LLP

(57) ABSTRACT

A method of making a mobile ion regulated device includes stacking a dielectric layer on a substrate. Mobile ions are placed within the dielectric layer. An electrode layer is provided on the dielectric layer. The mobile ions are directed to a designated area of the dielectric layer.

14 Claims, 9 Drawing Sheets

(56) References Cited

U.S. PATENT DOCUMENTS

| | | | | |
|---|---|---|---|---|
| 7,412,428 | B2 * | 8/2008 | Nugent | G06N 3/088 |
| | | | | 706/26 |
| 9,224,946 | B2 | 12/2015 | Kim et al. | |
| 9,379,319 | B2 | 6/2016 | Lee et al. | |
| 10,079,341 | B1 | 9/2018 | Bedell et al. | |
| 10,429,343 | B1 | 10/2019 | Talin et al. | |
| 12,015,066 | B2 * | 6/2024 | Chang | H10D 84/0144 |
| 2006/0121661 | A1 | 6/2006 | Yang et al. | |
| 2018/0287058 | A1 * | 10/2018 | Xia | G11C 13/0035 |
| 2022/0036168 | A1 | 2/2022 | Choi et al. | |
| 2022/0138544 | A1 | 5/2022 | Pesic | |
| 2022/0140146 | A1 | 5/2022 | Pesic | |

FOREIGN PATENT DOCUMENTS

| | | | |
|---|---|---|---|
| EP | 4631105 | A1 | 10/2025 |
| KR | 102211320 | B1 | 2/2021 |
| KR | 10-2022-0014794 | A | 2/2022 |
| WO | 2021/254769 | A1 | 12/2021 |
| WO | 2024/121637 | A1 | 6/2024 |

OTHER PUBLICATIONS

Fuller, E. J. et al., "Li-Ion Synaptic Transistor for Low Power Analog Computing", Advanced Materials (2017), vol. 29, 8 pgs.

Strukov, D. B. et al., The Missing Memristor Found, Nature (2008), vol. 453, pp. 5 pgs.

Strukov, D. B. et al., "Exponential Ionic Drift: Fast Switching and Low Volatility of Thin-Film Memristors", Applied Physics A (2009), vol. 94, pp. 515-519.

International Searching Authority, "Invitation to Pay Additional Fees and Partial Search Report" Patent Cooperation Treaty, Jan. 31, 2024, 11 pages, International Application No. PCT/IB2023/060426.

International Searching Authority, "Notification of Transmittal of the International Search Report and the Written Opinion of the International Searching Authority, or Declaration," Patent Cooperation Treaty, Mar. 21, 2024, 18 pages, International Application No. PCT/IB2023/060426.

S. Zafar et al., "Charge trapping in high K gate dielectric stacks", Electron Devices Meeting, 2002, IEDM '02, Feb. 2002, 15 pages, doi: 10.1109/IEDM.2002.1175893.

* cited by examiner

REGULATED MOBILE ION SYNAPSES

BACKGROUND

Technical Field

The present disclosure generally relates to memories used in Artificial intelligence (AI), and more particularly, to artificial synapses to carry on a weight update in AI networks.

Description of the Related Art

Synapses in a human brain use transmitters constructed of positive mobile ions such as Na+, K+, Ca+, H+, to function. In fields such as artificial intelligence, the development of artificial synapses that operatively are based on actual human synapses (e.g., "bio-inspired" synapses) is a growing area of research.

In a neural network, weights associated with neuron connections are adjusted after forward passes of data through the network. The updating of weights helps to reconcile differences between actual and predicted outcomes for multiple forward passes. For neuromorphic computing purposes, artificial synapses are used to perform a weight update in deep neural networks. There have been investigations of analog memory evaluation from digital memory development, such as phase change memory (PCM), resistive random access memory (RRAM), ferroelectric, floating gate, and an electrical-chemical approach for Li+ based structures. However, symmetric updating remains challenging. For example, in semiconductors associated with AI, the mobile ions in oxide or high dielectric constant (High-K) materials are known to cause serious problems of instability in MOS capacitors, and the mobile ions can be detected by a flatband shift ($DV_{fb}$) after a certain stress (e.g., bias thermal stress (BTS)) test.

SUMMARY

According to an embodiment, a computer-implemented method of making a mobile ion regulated device includes stacking one or multiple layer(s) of a dielectric layer on a substrate. Mobile ions are provided within the dielectric layer. An electrode layer is provided on the dielectric layer. The mobile ions are directed to a designated area of the dielectric layer. The arrangement of the mobile ions to designated area(s) of the dielectric layer permits multiple level of states for analog computing and, for example, analog synapse that may be used in neural networks. A faster, more efficient form of AI may result.

In one embodiment, which may be combined with the previous embodiment, the method includes forming a 3-terminal device from the mobile ion regulated device by patterning the electrode layer into one or more gates; and forming a source and a drain on the substrate. Such 3-terminal FETs can be used to regulate the mobile ions and permit symmetric updating. Symmetric diffusion can be provide to mimic biologically plausible synapses that can benefit AI, particularly in fields such as neural networks.

In one embodiment, which may be combined with previous embodiments, the driving of the mobile ions includes biasing the dielectric layer with a voltage. The applied voltage can direct the mobile ions to alignment areas that overcome instability issues in MOS capacitors.

In one embodiment, which may be combined with the previous embodiments, the method includes providing multiple states of the 3-terminal device for analog computing by driving the mobile ions to different locations in the dielectric layer. The different locations can represent different states for more accurate neural networks with an increased speed of operation.

In one embodiment, which may be combined with the previous embodiments, the method includes providing a plurality of gate stacks on the substrate including a plurality of superlattice High-K (HK) stacks and confining multiple layers of mobile ions. The plurality of gate stacks provides a way to confine the mobile ions for more accurate control and positioning.

In one embodiment, which may be combined with the previous embodiments, the method includes providing a plurality of gate stacks on the substrate including a superlattice material selected from the group consisting of alternative HK layers such as $HfSiO_4$, $HfO_2$, $HfSiO_4$, $HfO_2$, $HfSiO_4$, $HfO_2$, or $HfSiO_4$. Alternatively, Hf in HK stacks can be replaced by Zr, Al, Y) The superlattice structure with different band structures improves the regulation of the mobile ions.

In one embodiment, which may be combined with the previous embodiments, the method includes providing a plurality of gate stacks including a plurality of band gaps constructed of alternately-arranged dielectric materials. The plurality of band gaps of various layers allows for more accurate regulation of the mobile ions.

In one embodiment, which may be combined with the previous embodiments, the method includes performing symmetrical set and reset operations by driving a same number of mobile ions in the dielectric layer in a first direction for a set operation and a second direction opposite the first direction in a reset operation. The driving of the mobile ions to set and reset operations increases the accuracy and speed of the 3-terminal structure, and permits its use as an analog synapse in neural network.

In one embodiment, which may be combined with the previous embodiments, the driving of the mobile ions includes heating the dielectric layer. The heating of the dielectric layer can increase the accuracy of the application of the bias voltage, or alternatively can be used without a voltage to arrange the mobile ions.

In one embodiment, which may be combined with the previous embodiments, the driving of the mobile ions includes heating the dielectric layer before or during the biasing of the electrode layer. Heating the dielectric layer combined with applied voltage bias makes for a more accurate and faster arrangement of the mobile ions.

In one embodiment, which may be combined with the previous embodiments, the method includes tuning the conductance in an adjacent channel layer by reapplying at least one of the biasing or the heating of the dielectric layer. The tuning provides for a more accurate arrangement of the mobile ions.

According to one embodiment, a method of making a mobile ion regulated device includes growing a thermal dielectric layer on a substrate. An embedded gate is defined in the thermal dielectric layer by metallization reactive ion etching. Additional thermal dielectric is added on the thermal dielectric layer and performing chemical mechanical polishing (CMP). A high-k material is deposited on the thermal dielectric layer and placing mobile ions in the high-k material. Channel materials are deposited on the high-k material, and the source and drain (S/D) contacts are defined on the channel materials. The embedded gate is an alternative construction to a top gate, and enhances manufacturing because of the use of CMOS comparable metallization in construction of the 3-terminal FET.

In one embodiment, which may be combined with the previous embodiments, the channel materials in the depositing of the high-k material operation are selected from the group consisting of an organic semiconductor, an oxide semiconductor, or carbon nanotubes. The construction allows for advanced technology nodes.

In one embodiment, which may be combined with the previous embodiments, the depositing of the high-k material is arranged to form alternating layers of high-k material with different band gaps and placing mobile ions in more than one of the alternating layers of the high-k material. A more accurate arrangement of the mobile ions is obtained.

In one embodiment, which may be combined with the previous embodiments, a plurality of gate stacks on the substrate including a superlattice material selected from the group consisting of $HfSiO_4$, $HfO_2$, $HfSiO_4$, $HfO_2$, $HfSiO_4$, $HfO_2$, or $HfSiO_4$. The aforementioned materials make for symmetric updating and the ability to mimic biologically plausible synapses following the diffusion of ions.

According to one embodiment, a mobile ion regulated device includes a 3-terminal FET device structure including a gate stack filled with mobile ions. The gate stack includes a plurality of layers of material arranged to confine the mobile ions. A source, a drain and a gate are arranged on the substrate. A voltage biasing is arranged between at least one of the gate and the source, or between the source and the drain. The arrangement of the mobile ions to designated area(s) of the dielectric layer permits multiple level of states for analog computing and, for example, analog synapse that may be used in neural networks. A faster, more efficient form of AI may result.

In one embodiment, which may be combined with the previous embodiments, the gate includes a top gate arranged above the substrate. The gate material of the gate stack includes layers of a dielectric material. The gate stack confines the mobile ions in the layers of the dielectric material. The voltage biasing is configured to control arrangement of the mobile ions within the layers. The applied voltage can direct the mobile ions to alignment areas that overcome instability issues in MOS capacitors.

In one embodiment, which may be combined with the previous embodiments, the gate is an embedded gate arranged within a dielectric layer on the substrate. The gate material of the gate stack are layers of a high-k superlattice. The voltage biasing is configured to control an arrangement of the mobile ions within the layers of the high-k superlattice material. The high-k superlattice materials make for symmetric updating and the ability to mimic biologically plausible synapses following the diffusion of ions.

In one embodiment, which may be combined with the previous embodiments, the high-K superlattice material is selected from the group consisting of $HfSiO_4$, $HfO_2$, $HfSiO_4$, $HfO_2$, $HfSiO_4$, $HfO_2$, or $HfSiO_4$. The aforementioned materials are particularly suited for the superlattice material.

In one embodiment, which may be combined with the previous embodiments, the 3-terminal FET structure is configured as an analog synapse including the voltage biasing is configured to provide a rest state, a depression state, a potentiation state, and a read state negative based on a respective arrangement of at least the mobile ions within the 3-terminal FET device. The various states permits the use as an analog synapse in a neural network.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1A:
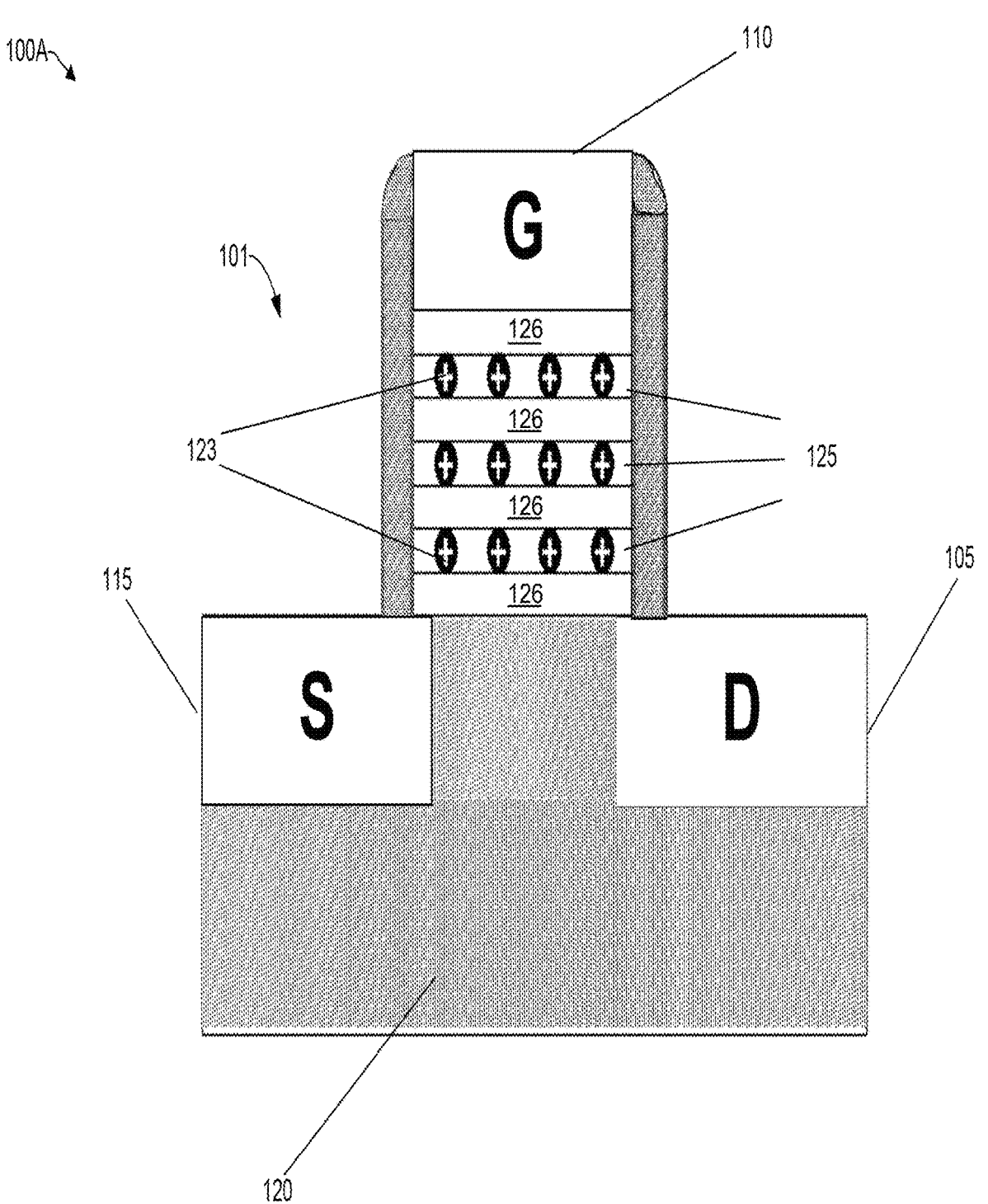
FIG. 1A is an illustration of a 3-terminal device including mobile ion-filled gate stacks, consistent with an illustrative embodiment.

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements or more elements than shown and described.

Efforts have been made to remove the impure mobile ions through process optimization. However, according to the present disclosure, the impure mobile ions may be regulated and used in a confined and a controllable manner that is advantageous for a synapse application in AI.

As used herein, the term "dielectric" is to be interpreted broadly and may include oxide materials such as SiO2, HfO2, ZrO2, HfSiO and HfZrO, and non-oxide materials such as SiN and AlN.

FIG. 1A is an illustration 100A of a 3-terminal device 101 including mobile ion-filled gate stacks 125, consistent with an illustrative embodiment. The 3-terminal device in FIG. 1A is an FET, but it is to be understood that the present disclosure is not limited to regulating mobile ions on an FET. The 3-terminal device 101 includes a drain 105, gate 110, and a source 115. The drain 105 and the source 115 are arranged on a substrate 120. The drain 105 and source 115 may include drain an embedded source and drain, or a top source and drain with a deposited transferred channel.

Figure 1B:
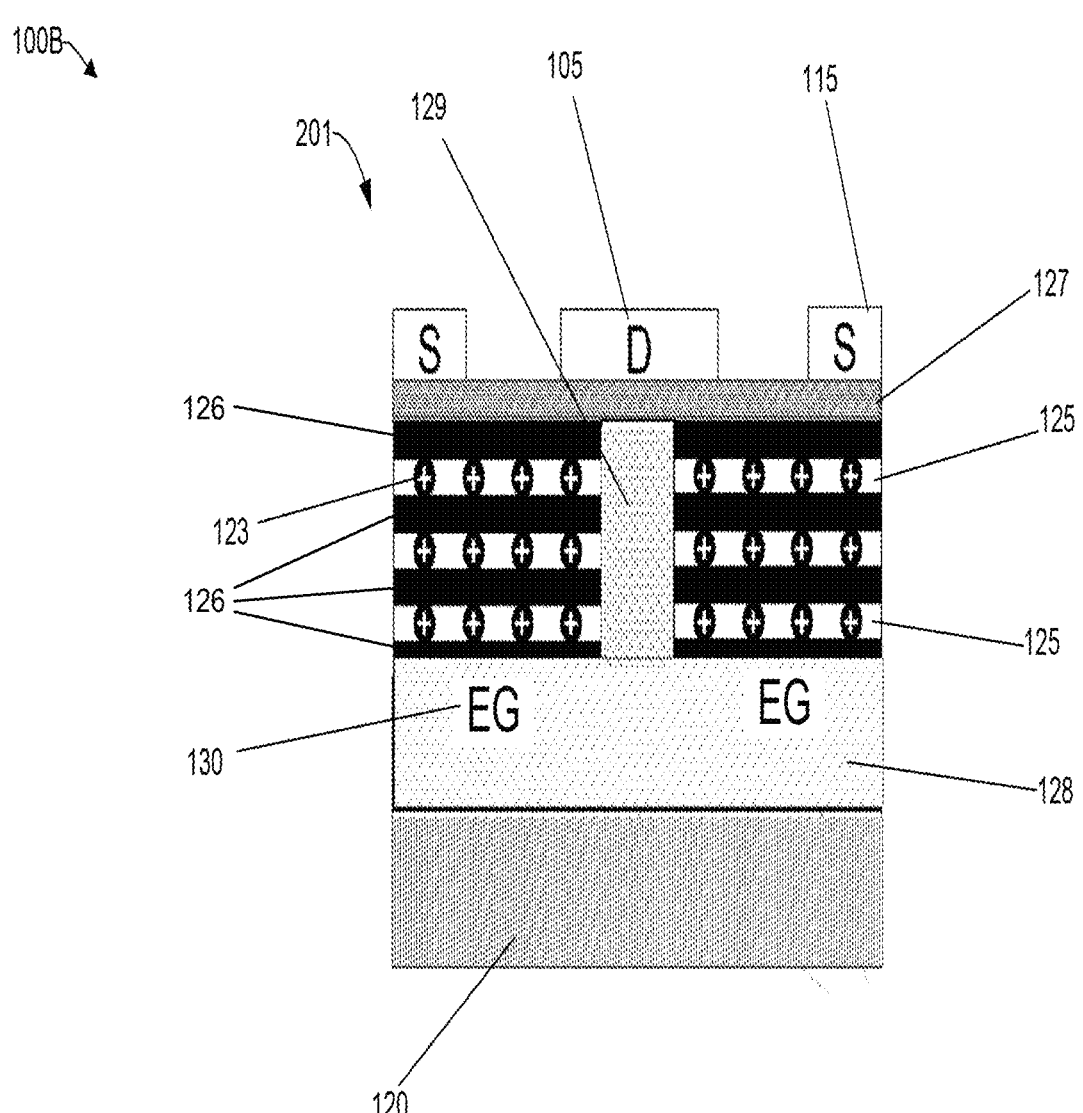
FIG. 1B is an illustration of a 3-terminal device structure with an embedded gate and mobile-ion gate stacks, consistent with an illustrative embodiment.

The gate 110 shown in FIG. 1A is a top gate, but as shown in FIG. 1B, an embedded gate EG 130 may be used. The gate 110 may be arranged on one or more a gate stacks 125 including a layer of a dielectric material (e.g., SiO2, SiN, HK, or high-K superlattice stacks (e.g., HfSiO4, HfO2, HfSiO4, HfO2, HfSiO4, HfO2, HfSiO4).

The substrate 120 may be constructed of Si, but the disclosure is not limited to Si. For example, the substrate may be made of any suitable substrate material, such as, for example, monocrystalline Si, silicon germanium (SiGe), aluminum gallium arsenide (AlGaAs), AlGAN, AlAs, AlIAs, AlN, GaSb, GaAlSb, GaAs, GaAsSb, GaN, InSb, InAs, InGaAs, InGaAsP, InGaN, InN, InP and alloy combinations.

According to the present disclosure, the 3-terminal device with regulated mobile ion synapses and method of manufacture advantageously provides improved performance. For example, there is an improvement in the operation of three-terminal FETs, as well as an improvement in hardware for AI applications. The use of regulated mobile ions in AI networks (e.g., such as a neural network) provides an advantage for symmetric updating due to a symmetric diffusion mechanism. In addition, the 3-terminal device provides the feasibility to mimic biologically plausible synapses following the diffusion of ions in a semiconductor. A more accurate operation of a neural network at faster speeds may be achieved at a savings in power and a reduced computational load.

Additional advantages of device of the present disclosure are disclosed herein.

Examples of 3-Terminal Devices with Regulated Mobile Ions

FIG. 1B is an illustration 100B of a 3-terminal device 201 with an embedded gate and mobile-ion gate stacks, consistent with an illustrative embodiment. The device 201 includes a substrate 120 that may be construction of Si or another material as disclosed with regard to the substrate shown in FIG. 1A. The drain 105 and source 115 are arranged on a channel 127. On top of the substrate 120, there is a layer 128, which may be constructed of $SiO_2$. There is shown embedded gates (EG 130) in the layer 128. EG 130 may be formed by a CMOS comparable metallization and reactive-ion etching (RIE), followed by depositing more oxide and chemical-mechanical polishing (CMP). The plurality of gate stacks 125 are arranged above the EG 130. The gate stacks confine the mobile ions (identified by the plus signs). There are a plurality of alternating band gaps including band gaps 126 that alternate with the band gaps including the gate stacks 125 and form a heterostructure. The heterostructure enhances the confinement of mobile ions in a more orderly arrangement. The channel 129 is optional and serves to isolate materials by separating two heterostructures with HK stacks for scalability purposes of a high density synaptic array formation.

The channel 127 may be formed by depositing semiconductor materials or transferring channel materials (e.g., oxide/organic semiconductor, carbon nanotubes, 2D materials, etc. for advanced technology nodes.

Figure 2:
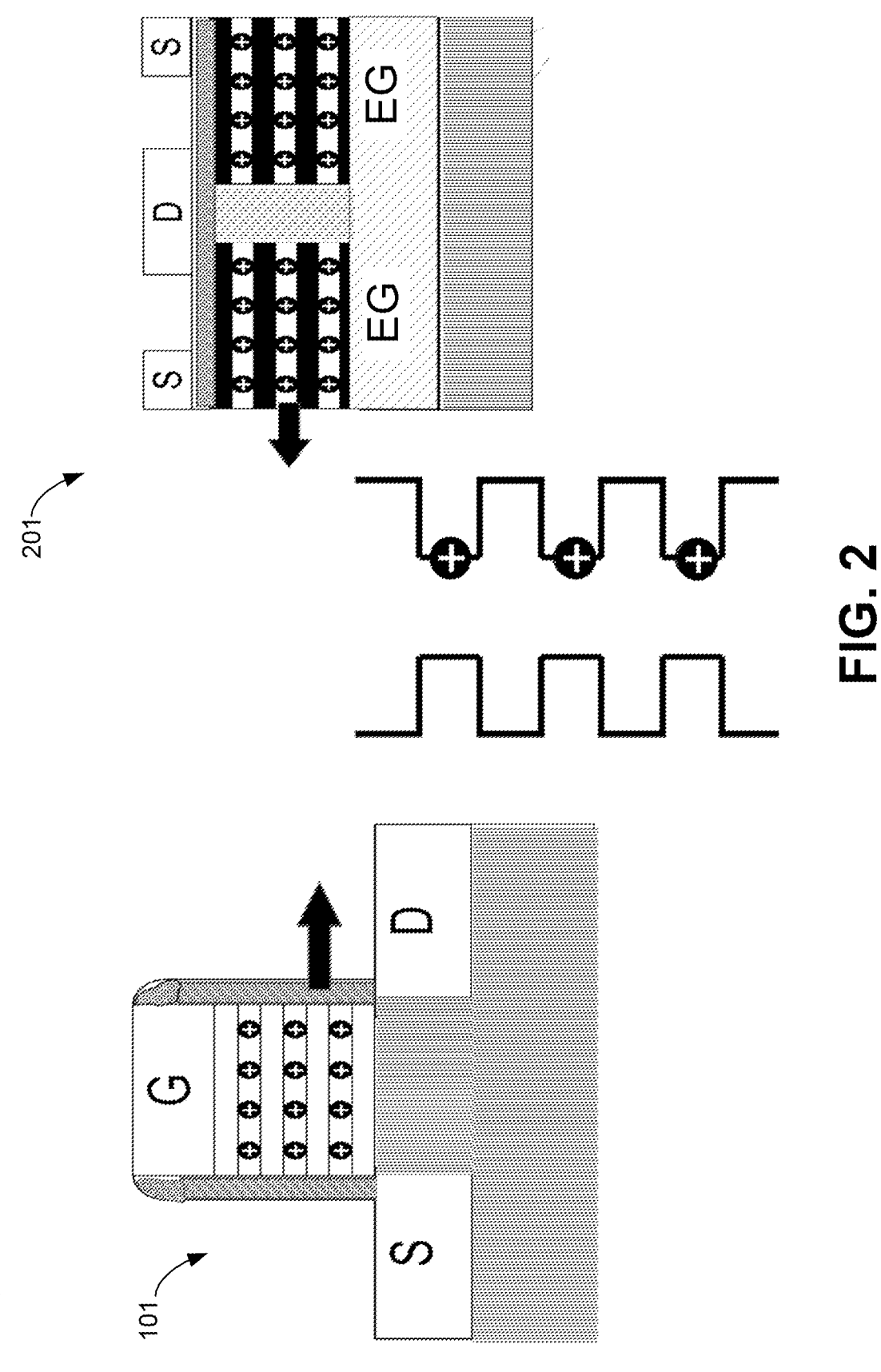
FIG. 2 illustrates the regulation of mobile ions in high-k stacks in 3 terminal devices such as shown in FIGS. 1A and 1B, consistent with an illustrative embodiment.

FIG. 2 illustrates in 200 the regulation of mobile ions in high-k stacks in 3-terminal devices such as shown in FIGS. 1A and 1B, consistent with an illustrative embodiment. Here there may be a high-K superlattice used as a gate stack, or layers of dielectric material. The gate-stacked device 101 having a top gate, and a gate stacked device 201 having an embedded gate shown in FIG. 2 were already shown and described with regard to FIGS. 1A and 1B. FIG. 2 shows a possible band structure for the high-k super lattice to regulate mobile ions. The mobile ions (illustrated by + symbols) located in the narrow band gap dielectric have been regulated.

The gate stack may be a superlattice constructed of $HfSiO_4$, $HfO_2$, $HfSiO_4$, $HfO_2$, /$HfSiO_4$, $HfO_2$, $HfSiO_4$, just to name some non-limiting possible examples.

Figure 3:
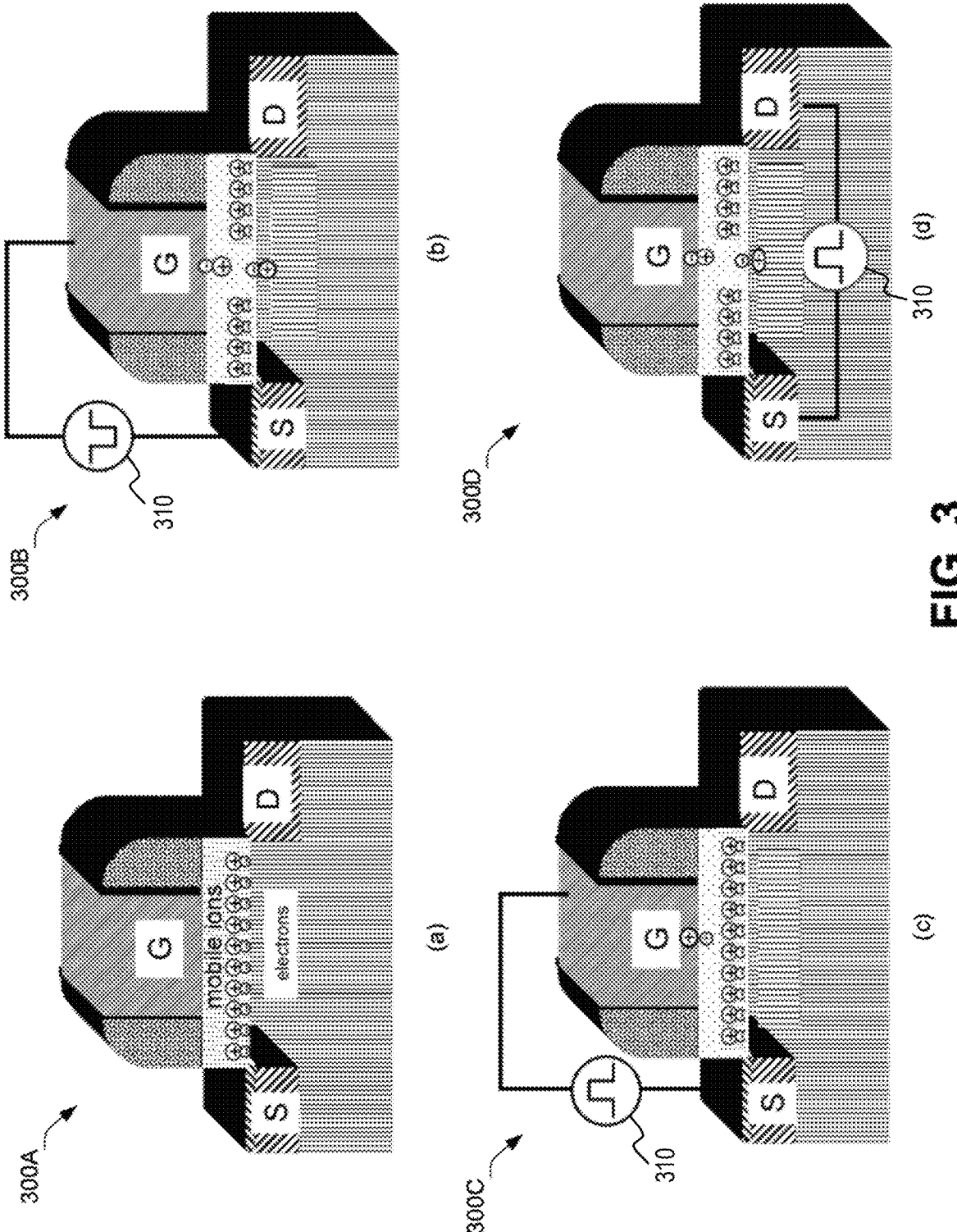
FIG. 3 illustrates an operation of an analog synapse using a 3-terminal device including regulated mobile ion-filled gate stacks, consistent with an illustrative embodiment.

FIG. 3 illustrates operations 300A-300D of an analog synapse using a 3-terminal device including regulated mobile ion-filled gate stacks, consistent with an illustrative embodiment. Example (a) shows a 3-terminal device with regulated mobile ions in a rest state. It is shown that the mobile ions identified by the plus signs, and the electrons (identified by the minus signs) are in a relatively aligned state. Example (b) shows a negative gate pulse (e.g., a depression) is applied to the device. There is movement of some of the electrons and mobile ions away from the aligned rows such as shown in example (a). Example (c) shows a positive gate pulse (potentiation) applied by a pulse generator 310. When compared with example (b), there is shown in example (c) a reversal of the position of the mobile ion and the electron pair that is directly under the gate. In example (d), a read pulse is applied between the source and the drain. Negative pulse(s) may supply electrons to attract positive mobile ions, leaving the negative charge(s) or electrons to pair up with holes in the channel, which is referred to as a depression. Subsequentially, positive pulses provide holes to recombine with electrons and release mobile ions to pair up with the electrons near channel which is called potentiation. The charges transported during depression and potentiation may be detected from the read current in the channel between the source and the drain. It is noted that an analog synapse can be used with the different structures (e.g., embedded gate, in FIG. 1B), and combined option shown in FIG. 2.

Example Process Flows

Figure 4:
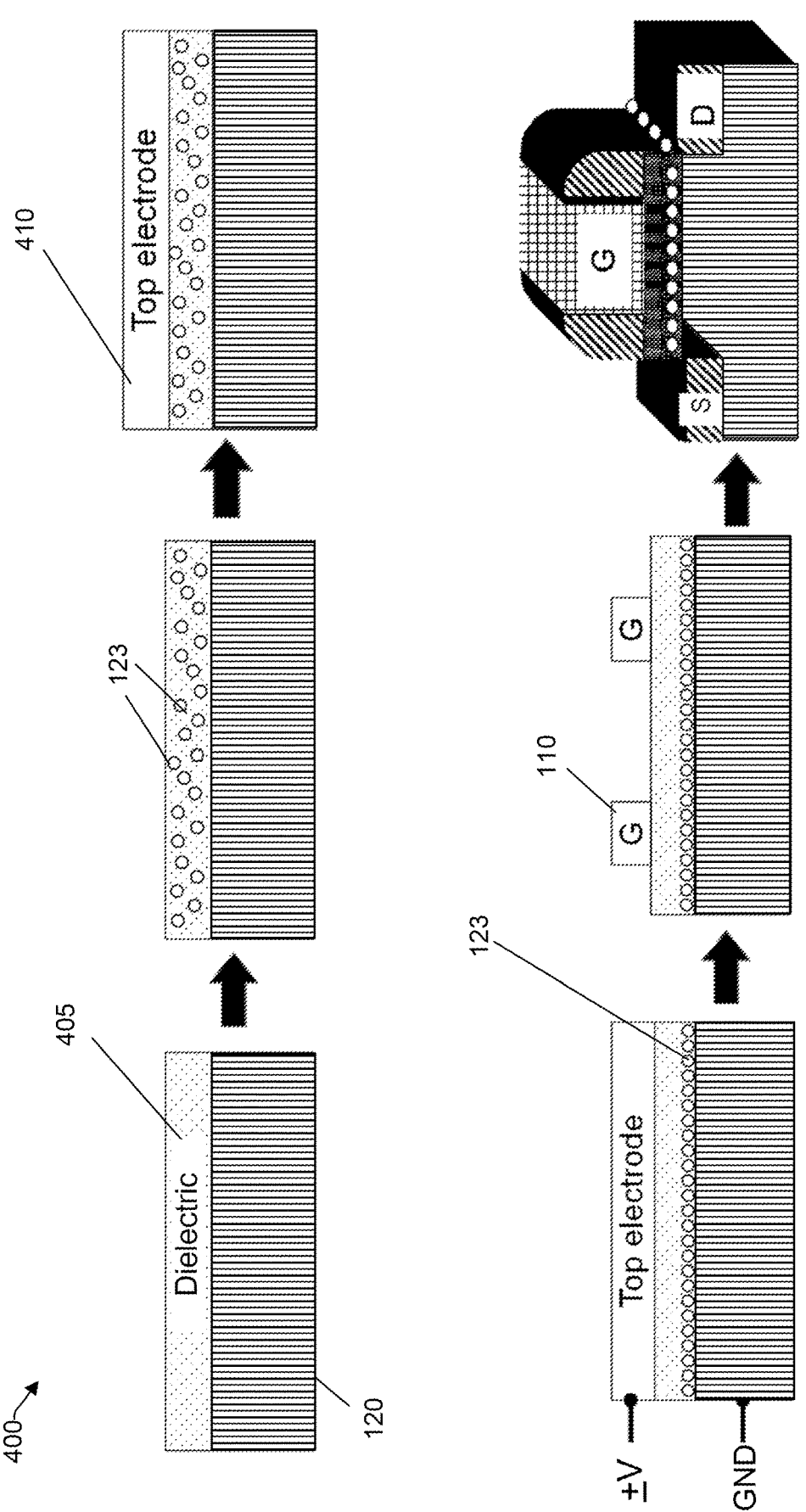
FIG. 4 illustrates a process flow for a stacked gate device with a mobile-ion regulation step, consistent with an illustrative embodiment.

FIG. 4 illustrates a process flow for a stacked gate device with a mobile-ion regulation step, consistent with an illustrative embodiment. For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Fabrication of the devices discussed herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, the device of FIG. 4 can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

The process flow shown starts with a substrate that may be made of Si (other materials may be used). A dielectric 405 is grown or deposited, or a high-K material arranged on the SI wafer, such as substrate 120. Mobile ions 123 are introduced into the dielectric 405 if such mobile ions were not incorporated with growing/depositing of dielectric (or H—K) on the substrate 120. A top conductive electrode 410 is deposited on the dielectric layer 405. Optionally, a bias (shown as V+/−) may be applied to the top electrode 410 and/or heating to drive mobile ions 123 to the bottom or top interface. A GND is connected to the substrate 120 particularly when a bias is applied to the top electrode 410. The top electrode 140 may be patterned as a gate contact 110 for each transistor on the substrate 120. Finally, the source/drain (S/D) formations are completed to complete the structure. A spacer (such as $SiO_2$/SiN stacks) may be included, and the process flow is complete.

Figure 5:
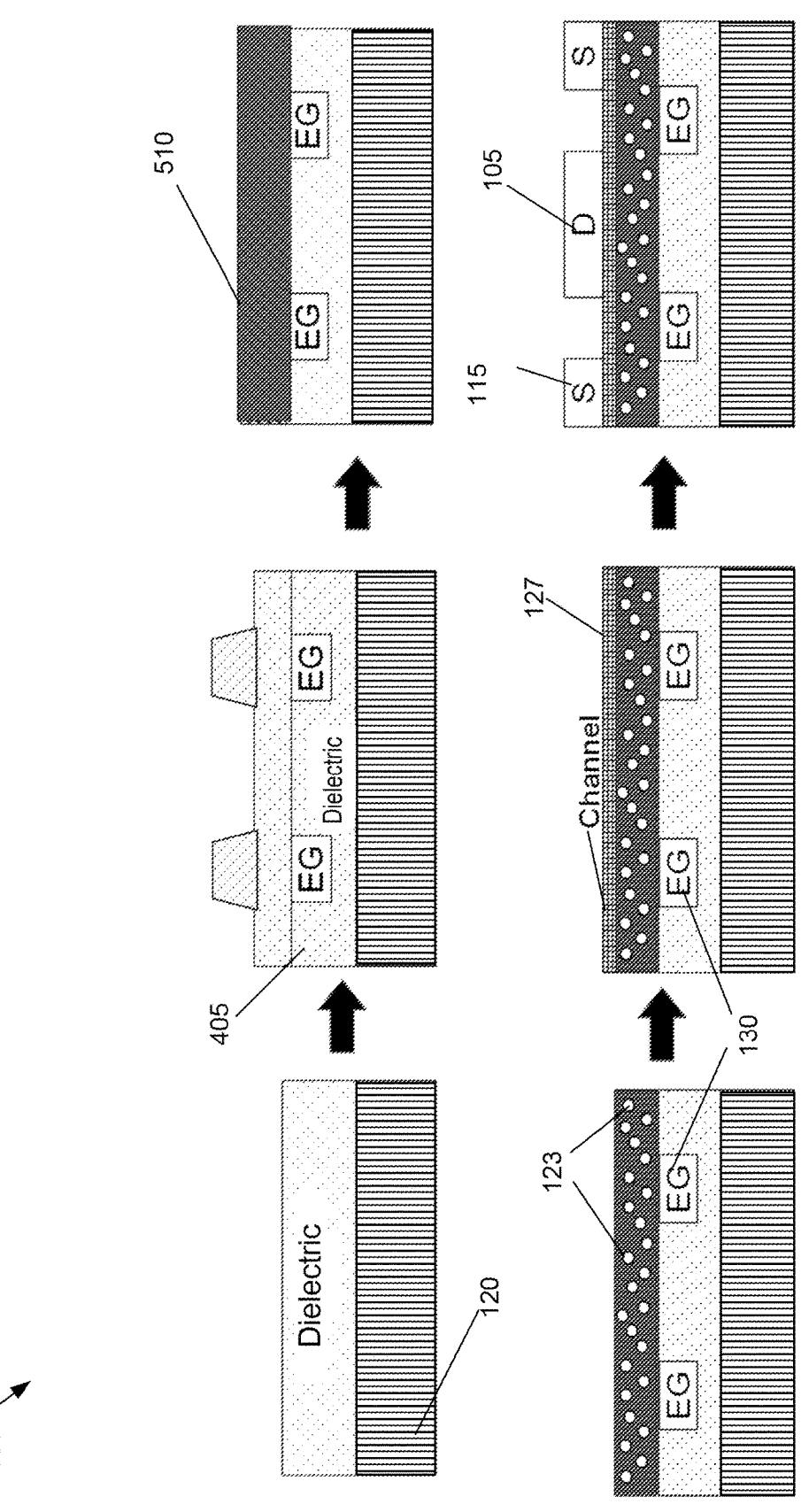
FIG. 5 illustrates a process flow for an embedded gate device with a mobile-ion regulation step, consistent with an illustrative embodiment.

FIG. 5 illustrates a process flow for an embedded gate device with a mobile-ion regulation step, consistent with an illustrative embodiment. The process flow in FIG. 5 has some difference with respect to the process flow in FIG. 4 because the gates are embedded. A thermal dielectric 405 may be grown on the substrate 120. In a non-limiting example, the substrate 120 used may be Si, and the dielectric used may be $SiO_2$. Embedded gates 130 may be defined by metallization and reactive-ion etching (RIE), followed by depositing more dielectric and chemical-mechanical polishing (CMP). A High-K material 510 or another dielectric is grown on the Si substrate 120. Mobile ions 123 may be incorporated into the dielectric 510 at the same time, or provided in a separate operation.

Still referring to FIG. 5, channel material 127 may be deposited or transferred onto the dielectric layer 510. The channel materials may include dielectric/organic semiconductor materials, carbon nanotubes, 2D materials, etc. Source 105 and drain 105 (S/D) contacts are then defined on the channel material 127. Passivation schemes may be employed to define the source and drain on the channel material.

Figure 6A:
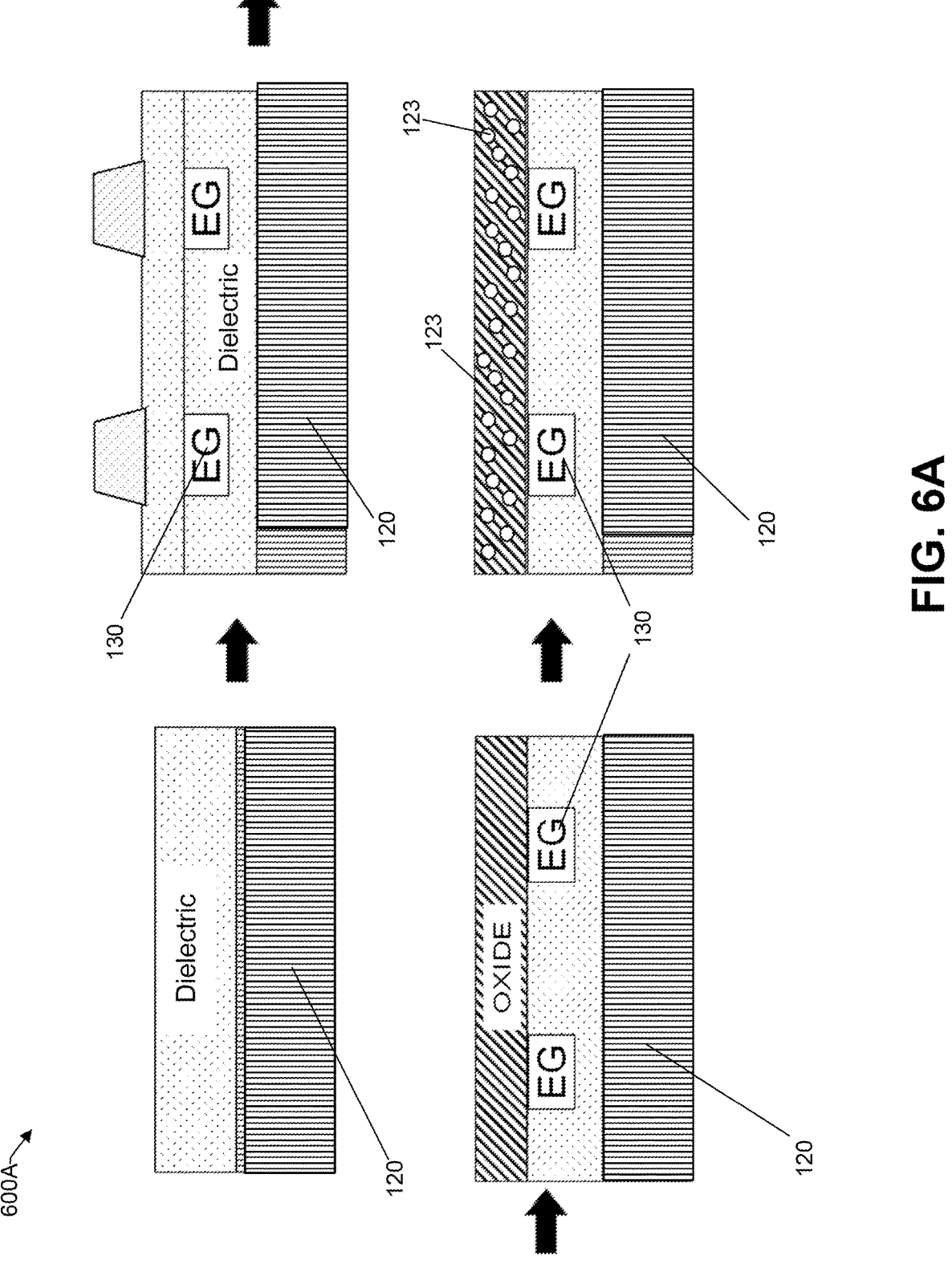
FIG. 6A illustrates a first part of a process flow for an embedded gate device with High-K stacks, consistent with an illustrative embodiment.

FIG. 6A illustrates a first part of a process flow for an embedded gate device with High-K stacks, consistent with an illustrative embodiment. A thermal oxide, which is shown as $SiO_2$ on a substrate 120. It is to be understood that present disclosure is not limited to the $SiO_2$ as the dielectric, and the substrate 120 is not limited to Si. An embedded gates (EG) is defined by performing metallization and RIE, then depositing more oxide and performing a CMP operation. Another oxide or a high-K material is grown/deposited on the Si substrate 120 and mobile ions 123 may be incorporated at the same time or introduced in a subsequent operation.

Figure 6B:
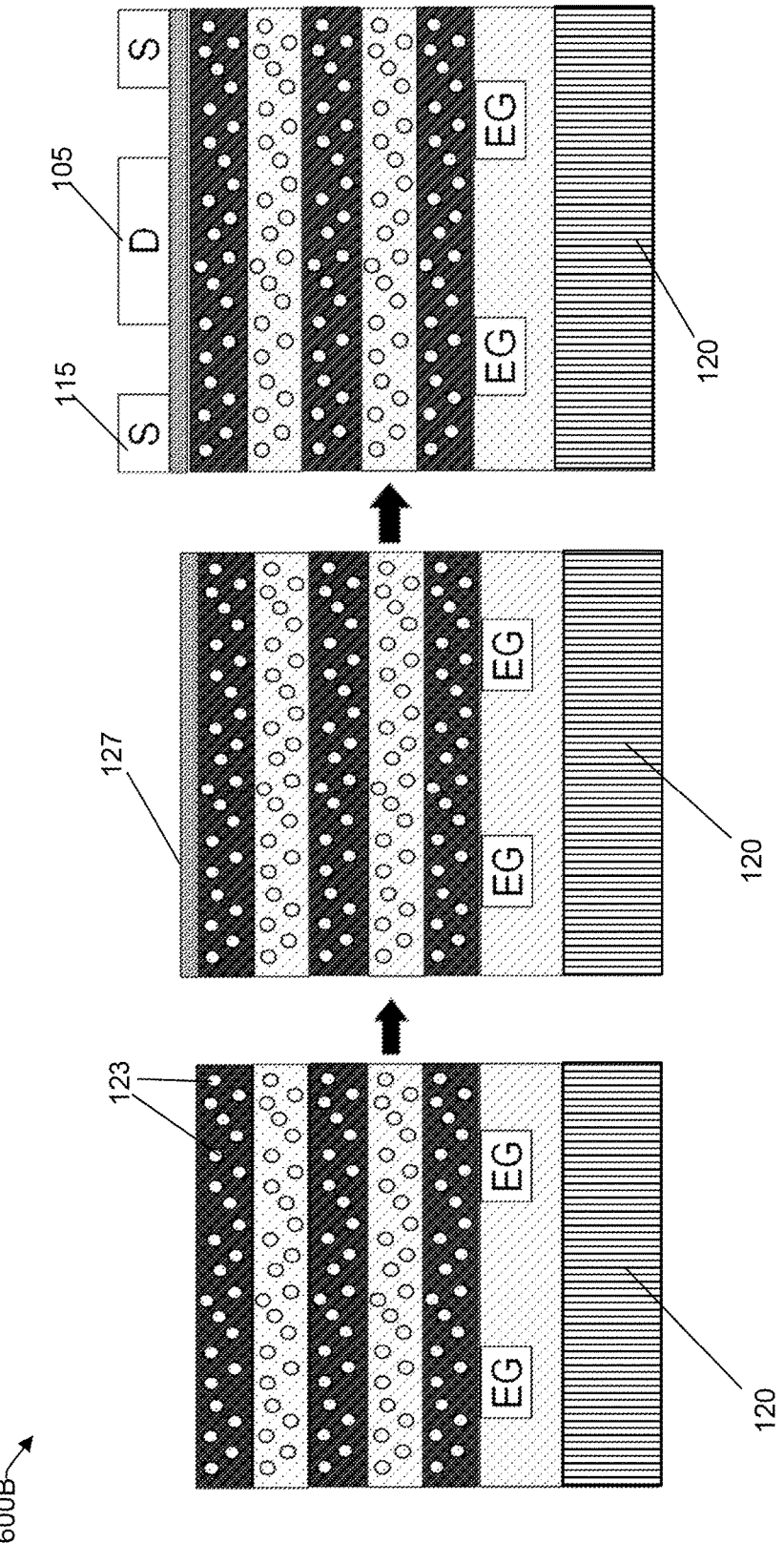
FIG. 6B illustrates a continuation of the process flow shown in FIG. 6A for an embedded gate device with High-K stacks, consistent with an illustrative embodiment.

FIG. 6B illustrates a continuation of the process flow shown in FIG. 6A for an embedded gate device with High-K stacks, consistent with an illustrative embodiment. The two process flows in FIG. 6A of growing/depositing dielectric or high-K on the Si wafer, including or followed by introducing mobile ions are repeated with alternate High-K layers with difference band gaps. The next operation includes depositing or transferring channel materials 127 (e.g. oxide/organic semiconductor carbon nanotube, 2D materials, etc.). Source 105 and Drain 105 (S/D) contact are defined. Passivation schemes may be applied.

Example Process

With the foregoing overview of the example architecture, it may be helpful now to consider a high-level discussion of an example process. To that end, FIG. 7 is a flowchart illustrating an operation of a device with mobile ion regulation, consistent with an illustrative embodiment.

Figure 7:
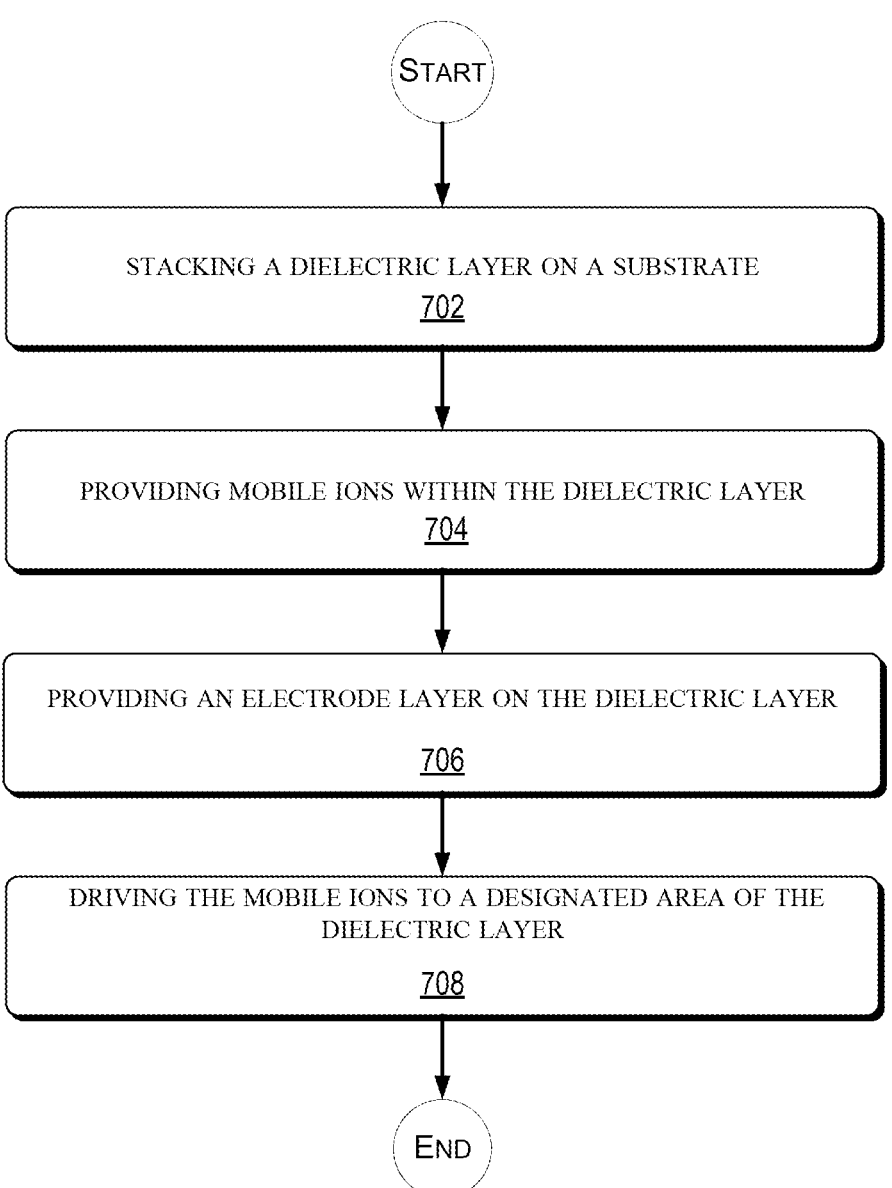
FIG. 7 is a flowchart illustrating an operation of a device with mobile ion regulation, consistent with an illustrative embodiment.

FIG. 7 is shown as a collection of blocks, in a logical order, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process.

At operation 702, there is performed a stacking of an dielectric layer on a substrate. For example, referring to FIG. 1A, the dielectric layer 128 may be an oxide such as an $SiO_2$ layer on a substrate 120. The substrate may be a silicon substrate. However, the present disclosure is not limited to an $SiO_2$ oxide and an Si substrate.

At operation 704, mobile ions are placed within the dielectric layer. For example, referring to FIG. 1A, a plurality of mobile ions 123 are arranged on gate stack layers. Referring to FIG. 4, mobile ions 123 are arranged within dielectric layer 405.

At operation 706, an electrode layer is provided on the dielectric layer. FIG. 4 shows a top electrode layer 410 arranged on the dielectric layer 405.

At operation 708, the mobile ions are driven to a designated area of the dielectric layer. FIG. 4 shows a voltage bias V+/− and ground nodes. When a voltage bias is applied, the scattered distributed of mobile ions changes to the aligned row of mobile ions shown. Different voltage levels, and/or different polarities will drive the mobile ions to different areas of the dielectric layer. The different positions can be used to construct an analog synapse. The method may end after operation 708.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A mobile ion regulated device, comprising:
a 3-terminal FET device structure including a gate stack comprising a plurality of layers of material filled with mobile ions;
a source, a drain and a gate arranged on a substrate; and
a pulse generator arranged between at least one of the gate and the source, or between the source and the drain,
wherein an arrangement of the plurality of layers of material confines the mobile ions within adjacent ones of the plurality of layers during a voltage bias applied by the pulse generator.

2. The device according to claim 1, wherein
the gate comprises a top gate arranged above the substrate.

3. The device according to claim 1, wherein:
the gate comprises an embedded gate arranged within a dielectric layer on the substrate;
the gate stack comprises a high-k superlattice; and
wherein the voltage bias controls an arrangement of the mobile ions within the layers of the high-k superlattice.

4. The device according to claim 3, wherein the high-K superlattice comprises alternating dielectric material layers having different band gaps.

5. The device according to claim 1, wherein:
the 3-terminal FET device structure is configured as an analog synapse; and
wherein the voltage bias is configured to provide a rest state, a depression state, a potentiation state, and a read state based on a respective arrangement of at least the mobile ions within the 3-terminal FET device structure.

6. The device according to claim 1, wherein the gate stack comprises layers of a high-k superlattice, and
the voltage bias controls an arrangement of the mobile ions within the layers of the high-k superlattice.

7. The device according to claim 6, wherein the layers of the high-k superlattice comprise alternating dielectric material layers having different band gaps.

8. The device according to claim 7, wherein each layer of the alternating dielectric material layers confines some of the mobile ions.

9. The device according to claim 7, wherein the voltage bias controls an arrangement of the mobile ions within each layer of the alternating dielectric material layers.

10. A 3-terminal FET device, comprising:
a substrate;
a source arranged on the substrate;
a drain arranged on the substrate;

a gate stack arranged on the substrate between the source and the drain and comprising a plurality of layers of a high-k superlattice comprising alternating dielectric material layers having different band gaps, wherein each of layer of the plurality of layers includes mobile ions; and a top gate arranged on the gate stack.

11. The 3-terminal FET device of claim 10, configured as an analog synapse including a pulse generator arranged between at least one of the top gate and the source or between the source and the drain, wherein a voltage bias applied by the pulse generator is configured to provide a rest state, a depression state, a potentiation state, and a read state negative based on a respective arrangement of the mobile ions within the alternating dielectric material layers.

12. The 3-terminal FET device of claim 10, wherein a voltage bias controls an arrangement of the mobile ions within the plurality of layers of the high-k superlattice.

13. The 3-terminal FET device of claim 12, wherein each layer of the alternating dielectric material layers confines some of the mobile ions.

14. The 3-terminal FET device of claim 13, wherein the voltage bias is configured to control arrangement of the mobile ions within each layer of the alternating dielectric material layers.

\* \* \* \* \*